United States Patent
Han et al.

(10) Patent No.: US 9,620,241 B2
(45) Date of Patent: Apr. 11, 2017

(54) SHIFT REGISTER UNIT, METHOD FOR DRIVING THE SAME, SHIFT REGISTER AND DISPLAY DEVICE

(71) Applicant: BOE TECHNOLOGY GROUP CO., LTD., Beijing (CN)

(72) Inventors: Seungwoo Han, Beijing (CN); Xing Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 149 days.

(21) Appl. No.: 14/416,029

(22) PCT Filed: May 21, 2014

(86) PCT No.: PCT/CN2014/077980
§ 371 (c)(1),
(2) Date: Jan. 20, 2015

(87) PCT Pub. No.: WO2015/014149
PCT Pub. Date: Feb. 5, 2015

(65) Prior Publication Data
US 2016/0064098 A1 Mar. 3, 2016

(30) Foreign Application Priority Data

Jul. 27, 2013 (CN) .......................... 2013 1 0320479
Dec. 31, 2013 (CN) .......................... 2013 1 0750479

(51) Int. Cl.
*G09G 3/32* (2016.01)
*G11C 19/28* (2006.01)
(Continued)

(52) U.S. Cl.
CPC .......... *G11C 19/28* (2013.01); *G09G 3/3225* (2013.01); *G09G 3/3266* (2013.01); *G09G 2300/0842* (2013.01); *G09G 2310/0286* (2013.01)

(58) Field of Classification Search
CPC .... G11C 19/28; G09G 3/3225; G09G 3/3266; G09G 2310/0286; G09G 2300/0842
See application file for complete search history.

(56) References Cited

U.S. PATENT DOCUMENTS 6,426,743 B1* 7/2002 Yeo ...................... G09G 3/3677
345/100
2001/0005247 A1 6/2001 Kikkawa
(Continued)

FOREIGN PATENT DOCUMENTS

CN 102629444 A 8/2012
CN 102708925 A 10/2012
(Continued)

OTHER PUBLICATIONS

International Search Report and Written Opinion mailed Aug. 26, 2014 regarding PCT/CN2014/077980. Translation provided by Dragon Intellectual Property Law Firm.
(Continued)

*Primary Examiner* — Christopher E Leiby
(74) *Attorney, Agent, or Firm* — Harness, Dickey & Pierce, P.L.C.

(57) ABSTRACT

According to an embodiment of the present disclosure, a shift register unit may include: a first control module, configured to transmit a start signal to a first node; a second control module, configured to pull a potential of a second node to a potential different from a potential of the first node, under a control of a first clock signal; a carry output module, configured to output a carry signal according to the potential of the first node and the potential of the second node; and a
(Continued)

shift output module, configured to output a shift signal according to the potential of the first node and the potential of the second node.

19 Claims, 8 Drawing Sheets

(51) Int. Cl.
*G09G 3/3225* (2016.01)
*G09G 3/3266* (2016.01)

(56) References Cited

U.S. PATENT DOCUMENTS

2008/0048712 A1* 2/2008 Ahn .................. G09G 3/3677
326/21

2011/0199354 A1* 8/2011 Iwase .................. G09G 3/3677
345/208
2012/0262438 A1* 10/2012 Shang .................. G11C 19/28
345/211
2014/0093028 A1* 4/2014 Wu ........................ G11C 19/28
377/64

FOREIGN PATENT DOCUMENTS

| CN | 102779478 A | 11/2012 |
|---|---|---|
| CN | 102783025 A | 11/2012 |
| CN | 103413514 A | 11/2013 |
| CN | 103700357 A | 4/2014 |
| CN | 203773916 U | 8/2014 |
| JP | 2001308340 A | 11/2001 |

OTHER PUBLICATIONS

Chinese Office Action mailed Apr. 17, 2015 regarding Chinese Application No. 201310750479.6. Translation provided by Dragon Intellectual Property Law Firm.

* cited by examiner

SHIFT REGISTER UNIT, METHOD FOR DRIVING THE SAME, SHIFT REGISTER AND DISPLAY DEVICE

CROSS-REFERENCE TO RELATED APPLICATION

This application is the U.S. national phase of PCT Application No. PCT/CN2014/077980 filed on May 21, 2014, which claims priority to Chinese Patent Application No. 201310320479.2 filed on Jul. 27, 2013 and No. 201310750479.6 filed on Dec. 31, 2013, the disclosures of which are incorporated in their entirety by reference herein.

TECHNICAL FIELD

The present disclosure relates to the field of organic light-emitting display, in particular to a shift register unit, a method for driving the same, a shift register and a display device.

BACKGROUND

In an active matrix display, each of scan lines and each of data lines are intersected to each other to form an active matrix. Generally, by using a progressive scanning method, gates of respective gate lines are turned on sequentially, and voltages on data lines are written into pixels. A method of integrating line scanning driving circuits on the display backplane has narrow-frame and low-cost advantages and has been used in most of the Liquid Crystal Displays (LCDs) and Active Matrix Organic Light Emitting Diodes (AMO-LEDs).

Currently, there are many technologies for manufacturing a display device backplane, such as a-Si (amorphous silicon) Thin Film Transistors (TFT), Low Temperature Poly-Silicon (LTPS) TFTs, Oxide TFTs and the like. The a-Si TFTs are more mature and low-cost but have low mobility and low stability. The LTPS TFTs have fast speed and good stability, but also have poor uniformity and high cost, and are not suitable for the preparation of large-size panels. Oxide TFTs have high mobility, good uniformity and low cost, and are the technology most suitable for a large-size panel display. However, current-voltage (I-V) transferring characteristics of oxide TFTs are usually of depletion type. That is, when a gate-source voltage (Vgs) of an oxide TFT is zero, it is still in an ON state. If Gate Driver on Array (GOA) of the oxide TFTs continues to adopt the a-Si GOA circuit, a result that the TFTs cannot be completely turned off, causing multiple outputs, will occur.

A depletion-type thin film transistor (TFT) causes great difficulty for integrating shift registers on a display device backplane. FIG. 1A is a diagram showing a structure of a conventional shift register. In FIG. 1A, all transistors are n-type thin film transistors. As shown in FIG. 1A, the conventional shift register includes a first output transistor T1, a second output transistor T2, a first control module 11 controlling T1 and a second control module 12 controlling T2. Except for the last level shift register, an output end of each level shift register is connected to an input end of a next shift register, and alternately controlled by two clock signal CLK1, CLK2 of which duty ratios are 50% Amplitudes of all input signals and control signals are VGL~VGH. Here, the VGL is a low level while the VGH is a high level. The first output transistor T1 is connected to a clock signal CLKB and an output end OUT(n), and plays a role of transmitting the high level. The second output transistor T2 is connected to a low level output end which outputs the low level VGL and the output end OUT(n), and plays a role of transmitting the low level.

As shown in FIG. 1B, a work process of the shift register can be divided into three stages as follows.

The first stage is a pre-charge stage, in which when an output end OUT(n-1) of previous level shift register generates a high level pulse, the node PU (a node which is connected to a gate electrode of the transistor T1, i.e., the pulling up-node) is controlled to be charged to the high level VGH, while the node PD (a node which is connected to a gate electrode of the transistor T2, i.e., the pulling down-node) is controlled to be charged to the low level VGL; and at this time, the transistor T1 is turned on, so as to transmit the low level of CLKB to the output end OUT(n), while the transistor T2 is turned off.

The second stage is an evaluation stage. In a next clock cycle, the node PU is changed into a floating state, that is, all the transistors of the first output control module connected thereto are turned off so that no signal is transmitted thereto. The CLKB is changed from the low level to the high level. Along with the rise of the output voltage, the voltage of the node PU is bootstrapped to a higher level by a capacitor connected between the gate electrode of the transistor T1 and the output end OUT(n), thus ensuring that there is no threshold loss in the output voltage of the output end OUT(n). At this time, the node PD remains at the low level, so that the transistor T2 is turned off, preventing the high level outputted by the output end OUT(n) from leakage through T2.

The third stage is a reset stage, that is, in another next clock cycle; CLKB is changed into the low level while CLK is changed into the high level. So the node PU is discharged to the low level, the node PD is recharged to the high level. At this time, the transistor T1 is turned off and the transistor T2 is turned on, so that the output voltage of the output end OUT(n) maintains the low level by the transistor T2.

As shown in FIG. 1B, the node PU and the node PD forms a reciprocal relationship, so as to avoid transistor T1 and T2 being turned on simultaneously which will result in an abnormal output.

However, if the transistors T1 and T2 in FIG. 1A are depletion-type transistors, there will be a larger distortion generated in the output. Firstly, in the evaluation stage, the voltage of the node PU is high so that the transistor T1 is turned on. Although the voltage of the node PD is discharged to the low level VGL, yet due to depletion-type characteristics of the transistor T2, the transistor T2 cannot be turned off even its Vgs is zero, resulting in a leakage current. That is, the transistors T1 and T2 are conductive simultaneously, so the high level outputted by the output end OUT(n) depends on a resistance divided voltage of the transistors T1 and T2, which is typically much lower than a normally-required high level. Therefore, the normal operation of the next level shift register is affected, that is, the failure of the next level shift register may be caused. Secondly, in the reset stage, the voltage of the node PU is low while the voltage of the node PD is high, and the output voltage of the output end OUT(n) is low. But since the transistor T1 is a depletion-type transistor, the transistor T1 is always conductive (ON). If CLKB is changed to a high level, a high level pulse will be generated in the output voltage of the output end OUT(n), the potential thereof depends on a resistance divided voltage of the transistors T1 and T2. A normal waveform of the output voltage of the output end OUT(n) is as shown in solid lines in FIG. 1C, a distorted waveform of the output voltage of the output end OUT(n) is as shown in broken lines in FIG. 1C.

In addition to the first output transistor T1 and the second output transistor T2, depletion-type TFTs in an internal control circuit will also cause an output failure. As shown in FIG. 2A, the second control module is a pulling-down control module, and the first control module contains transistors T3 and T4. The transistors T3 and T4 are depletion-type transistors, wherein the transistor T3 is connected to an output end OUT (n−1) of a previous level shift register and the node PU (the node connected to the gate electrode of T1). The transistor T3 plays a role of charging the node PU to a high level in the pre-charge stage. A gate electrode of the transistor T4 is connected to a reset signal Rst. The transistor T4 is connected to the node PU and a low level output end outputting the low level VGL. The transistor T4 plays a role of pulling down the voltage of the node PU in the reset stage. The depletion-type transistors T3 and T4 will be conductive (ON) in the evaluation stage, pulling down the voltage of the node PU, so that the transistor T1 is caused to be not fully turned on, and the high level outputted by the output end OUT(n) is affected, as shown in broken lines in FIG. 2B.

In summary, there is a need of improving the circuit structure to solve the effect of depletion-type TFTs on the output of the shift register.

SUMMARY

Technical Problems to be Solved

An object of an embodiment of the present disclosure is to provide a shift register unit, a method for driving the same, a shift register and a display device, and to eliminate the effect of a direct current (DC) bias voltage on characteristics of TFTs inside the shift register unit, and solve the problem that an error output is caused by the TFTs inside the shift register unit since the TFTs cannot be completely turned off.

Technical Solutions

In order to achieve the above object, an embodiment of the present disclosure provides a shift register unit, including:

a first control module, configured to transmit a start signal to a first node;

a second control module, configured to pull a potential of a second node to a potential different from a potential of the first node, under a control of a first clock signal;

a carry output module, configured to output a carry signal according to the potential of the first node and the potential of the second node; and a shift output module, configured to output a shift signal according to the potential of the first node and the potential of the second node.

Alternatively, the shift register unit may further include: an output feedback module, configured to maintain the potential of the first node by controlling the first control module according to the carry signal and the shift signal.

Alternatively, the shift register unit may further include: a reset module, configured to control the shift signal to be reset.

Alternatively, the carry output module may include a first carry output transistor and a second carry output transistor;

a gate electrode of the first carry output transistor may be connected to the first node, a first electrode of the first carry output transistor may be connected to a carry signal output end, and a second electrode of the first carry output transistor may be connected to a second clock signal output end;

a gate electrode of the second carry output transistor may be connected to the second node, a first electrode of the second carry output transistor may be connected to a first low level output end, and a second electrode of the second carry output transistor may be connected to the carry signal output end;

a bootstrap capacitor may be connected between the gate electrode and the first electrode of the first carry output transistor.

Alternatively, the shift output module may include a first shift output transistor and a second shift output transistor;

a gate electrode of the first shift output transistor may be connected to the first node, a first electrode of the first shift output transistor may be connected to a shift signal output end, and a second electrode of the first shift output transistor may be connected to a second clock signal output end;

a gate electrode of the second shift output transistor may be connected to the second node, a first electrode of the second shift output transistor may be connected to a second low level output end, and a second electrode of the second shift output transistor may be connected to the shift signal output end.

Alternatively, the first carry output transistor, the second carry output transistor, the first shift output transistor and/or the second shift output transistor may be depletion-type thin film transistors (TFTs);

a threshold voltage of the first carry output transistor, a threshold voltage of the second carry output transistor, a threshold voltage of the first shift output transistor and a threshold voltage of the second shift output transistor may be all the same, which are a depletion threshold voltage.

Alternatively, the first low level may be less than the second low level, and an absolute value of a difference between the first low level and the second low level may be larger than an absolute value of the depletion threshold voltage.

Alternatively, the first control module may include a first control transistor, a second control transistor, a third control transistor and a fourth control transistor;

a gate electrode of the first control transistor may be connected to a first clock signal output end, a first electrode of the first control transistor may be connected to the output feedback module and the second electrode of the second control transistor respectively, and a second electrode of the first control transistor may be connected to an input end of the start signal;

a gate electrode of the second control transistor may be connected to the first clock signal output end, and a first electrode of the second control transistor may be connected to the first node;

a gate electrode of the third control transistor may be connected to the second node, a first electrode of the third control transistor may be connected to a second electrode of the fourth control transistor and the output feedback module respectively, and a second electrode of the third control transistor may be connected to the first node;

a gate electrode of the fourth control transistor may be connected to the second node, and a first electrode of the fourth control transistor may be connected to the first low level output end.

Alternatively, the second control module may include a fifth control transistor, a sixth control transistor and a holding capacitor;

a gate electrode of the fifth control transistor may be connected to the first clock signal output end, a first electrode of the fifth control transistor may be connected to the second node, and a second electrode of the fifth control transistor may be connected to the first clock signal output end;

a gate electrode of the sixth control transistor may be connected to the first node, a first electrode of the sixth control transistor may be connected to the first low level output end, and a second electrode of the sixth control transistor may be connected to the first electrode of the fifth control transistor;

the holding capacitor may be connected between the second node and the second low level output end.

Alternatively, the output feedback module may include a feedback transistor;

a gate electrode of the feedback transistor may be connected to the carry signal output end, a first electrode of the feedback transistor may be connected to the shift signal output end, and a second electrode of the feedback transistor may be connected to the first electrode of the first control transistor and the first electrode of the third control transistor respectively.

Alternatively, the reset module may include a reset transistor;

a gate electrode of the reset transistor may be connected to an input end of a reset signal, a first electrode of the reset transistor may be connected to the second low level output end, and a second electrode of the reset transistor may be connected to the shift signal output end.

Another embodiment of the present disclosure further provides a method for driving a shift register unit, which may be applied to the above-mentioned shift register unit, including the following steps:

transmitting, by the first control module, the start signal to the first node; and pulling, by the second control module, the potential of the second node to a potential inverted to the potential of the first node under the control of the first clock signal, in a pre-charge stage;

pulling, by the second control module, the potential of the second node to the potential inverted to the potential of the first node under the control of the first clock signal; outputting, by the carry output module, the carry signal according to the potential of the first node and the potential of the second node; outputting, by the shift output module, the shift signal according to the potential of the first node and the potential of the second node, in an evaluation stage.

Alternatively, the method for driving a shift register unit may further include:

maintaining, by the output feedback module, the potential of the first node by controlling the first control module according to the carry signal and the shift signal, in the pre-charge stage.

Alternatively, the method for driving a shift register unit may further include:

controlling, by the reset module, the shift signal to be reset, in a reset stage.

Yet another embodiment of the present disclosure further provides a shift register including multi-level shift register units described above;

except for a first level shift register unit, a start input end of each level shift register unit is connected to the carry signal output end of a previous level shift register unit.

Still yet another embodiment of the present disclosure further provides a display device including the above shift register.

The Advantageous Effects

An embodiment of the present disclosure at least has the advantageous effects as follows.

Compared to the related art, instead of a high voltage signal, an alternate current (AC) first clock signal is used in the shift register unit, the shift register and the display device according to an embodiment of the present disclosure, to control the second control module, which can reduce the effect of the DC bias voltage on characteristics of TFTs inside the shift register unit. And by using the design of two output end, the TFTs inside the shift register unit can be completely turned off, avoiding the erroneous output.

BRIEF DESCRIPTION OF THE DRAWINGS

In order to more clearly illustrate the technical solutions according to the embodiments of the present disclosure or the related art, accompany drawings acquired to use in the description of the embodiments will be described briefly below. It is obvious that, the described drawings are merely parts of embodiments of the present disclosure, and other drawings can also be obtained according to these drawings for a person skilled in the art without creative work.

DETAILED DESCRIPTION

Figure 1A:
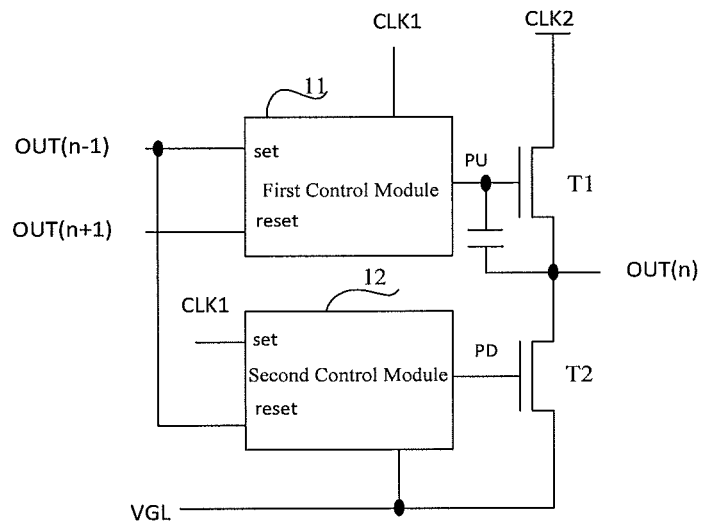
FIG. 1A is a diagram showing a circuit of a conventional shift register.
Figure 1B:
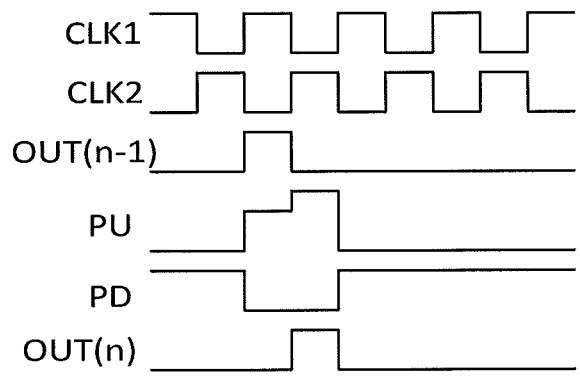
FIG. 1B is a sequence diagram of respective signals of a conventional shift register during working process.
Figure 1C:
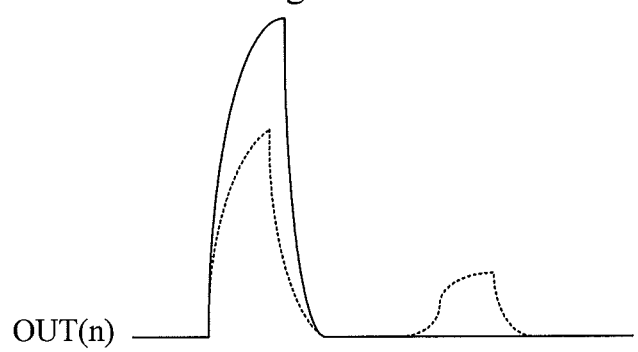
FIG. 1C is a diagram showing an output waveform of an output end OUT(n) of a conventional shift register.
Figure 2A:
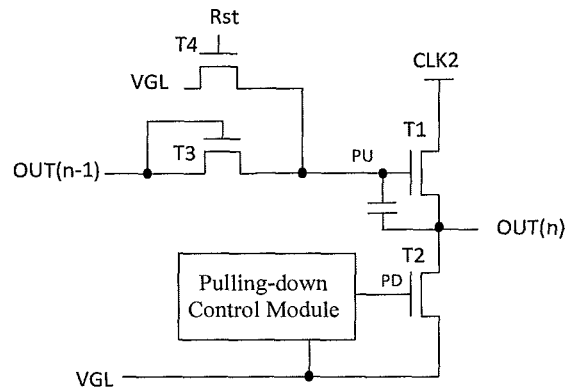
FIG. 2A is a diagram showing a circuit of a specific embodiment of a conventional shift register.
Figure 2B:
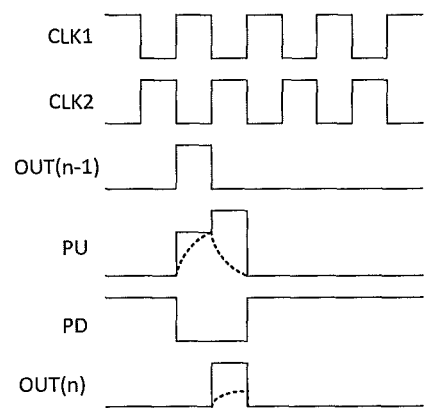
FIG. 2B is a sequence diagram of respective signals of a specific embodiment of a conventional shift register during working process.

Embodiments of the present disclosure will be further described in conjunction with the accompanying drawings and examples. The following embodiments are only used to illustrate the present disclosure, but are not intended to limit the scope of the invention.

In order to make the objects, technical solutions and advantages of the embodiments of the present disclosure more clear, the technical solutions according to the embodiments of the present disclosure will be clearly and fully described hereinafter in conjunction with the accompanying drawings in the embodiments of the present disclosure. Obviously, the described embodiments are merely parts of embodiments of the present disclosure, but not all the embodiments. Based on the embodiments in the present disclosure, all the other embodiments obtained by a person skilled in the art will fall within the protection scope of the present disclosure.

Unless otherwise defined, technical terms or scientific terms used herein shall have the general meaning which can be understood by a person skilled in the art. The terms "first", "second" or the like used in the specification and claims of the present disclosure do not denote any sequence, quantity, or importance, but rather are used to distinguish different components. Similarly, the terms "a" or "an" or the like do not mean quantitative restrictions, but rather indicate the presence of at least one. The terms "connect" or "couple" or the like are not limited to connect physically or mechanically, but may include connecting electrically either directly or indirectly. The terms "up", "down", "left", "right", etc., are merely used to indicate a relative positional relationship; when the absolute position of the described object is changed, the relative positional relationship is changed correspondingly.

Principles and features of embodiments of the present disclosure will be described in conjunction with the accompanying drawings. The following embodiments are only used to illustrate the present disclosure, but are not intended to limit the scope of the invention.

The transistors used in all embodiments of the present disclosure may be thin film transistors (TFTs) or field effect transistors (FETs) or other devices with same characteristics. In an embodiment of the present disclosure, in order to distinguish two electrodes except the gate electrode of a transistor, one is called as a source electrode and the other is called as a drain electrode. In addition, according to the transistor characteristics, the transistors can be divided into N-type transistors or P-type transistors. In a driving circuit provided by an embodiment of the present disclosure, all transistors are described with an example where all transistors are N-type transistors, and it is obvious that embodiments where P-type transistors are used in all transistors can be made by a person skilled in the art without creative work and therefore they also fall within the scope of the present disclosure.

In a driving circuit provided by an embodiment of the present disclosure, all transistors are described with an example where all transistors are N-type transistors. Here, a first electrode of the N-type transistor may be a source electrode, and a second electrode of the N-type transistor may be a drain electrode. It is obvious that embodiments where P-type transistors are used in all transistors can be made by a person skilled in the art without creative work and therefore they also fall within the scope of the present disclosure.

Figure 3:
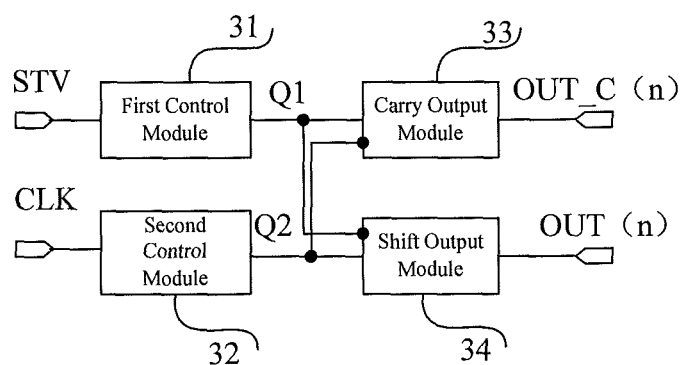
FIG. 3 is a block diagram showing a structure of a shift register unit according to an embodiment of the present disclosure.

As shown in FIG. 3, a shift register unit according to an embodiment of the present disclosure includes:

a first control module 31, configured to transmit a start signal to a first node Q1;

a second control module 32, configured to pull a potential of a second node Q2 to a potential different from a potential of the first node Q1, under a control of a first clock signal CLK;

a carry output module 33, configured to output a carry signal according to the potential of the first node Q1 and the potential of the second node Q2; and a shift output module 34, configured to output a shift signal according to the potential of the first node Q1 and the potential of the second node Q2.

In FIG. 3, the start signal is inputted by a start signal input end STV, the carry signal is outputted by a carry signal output end OUT_C(n), the shift signal is outputted by a shift signal output end OUT(n).

In the shift register unit according to an embodiment of the present disclosure, instead of a high voltage signal, an alternate current (AC) first clock signal CLK is used to control the second control module 32, which can reduce the effect of the DC bias voltage on characteristics of TFTs inside the shift register unit.

Further, in the shift register unit according to an embodiment of the present disclosure, by using the design of two output ends, the TFTs inside the shift register unit can be completely turned off, avoiding the erroneous output.

In another embodiment, the first control module 31 transmits the start signal to the first node Q1 in response to the first clock signal CLK.

Figure 4A:
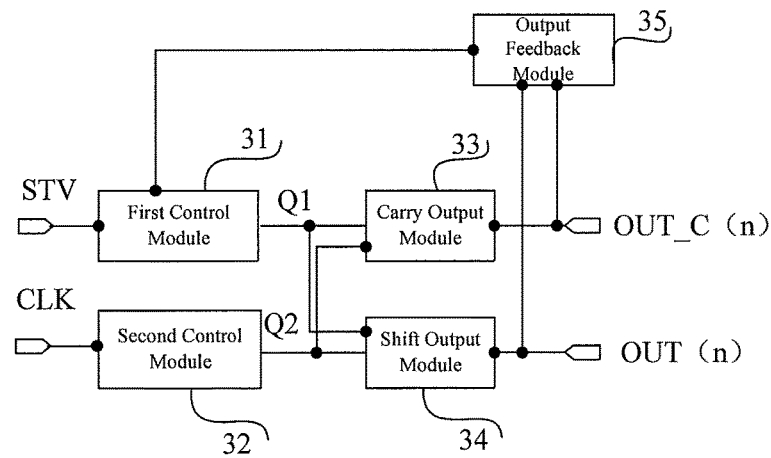
FIG. 4A is a block diagram showing a structure of a shift register unit according to another embodiment of the present disclosure.

In yet another embodiment, as shown in FIG. 4A, the shift register unit further includes:

an output feedback module 35, configured to maintain the potential of the first node Q1 by controlling the first control module 31 according to the carry signal and the shift signal.

Specifically, when the shift register unit as shown in FIG. 4A works, there are a pre-charge stage and an evaluation stage.

In the pre-charge stage, the first control module 31 transmits the start signal to the first node Q1; and the second control module 32 pulls the potential of the second node Q2 to a potential inverted to the potential of the first node Q1 under the control of the first clock signal CLK.

In the evaluation stage, the first control module 31 maintains the potential of the first node Q1; the second control module 32 pulls the potential of the second node Q2 to the potential inverted to the potential of the first node Q1 under the control of the first clock signal CLK. At the same time, the carry output module 33 outputs the carry signal according to the potential of the first node Q1 and the potential of the second node Q2; the shift output module 34 outputs the shift signal according to the potential of the first node Q1 and the potential of the second node Q2.

Figure 4B:
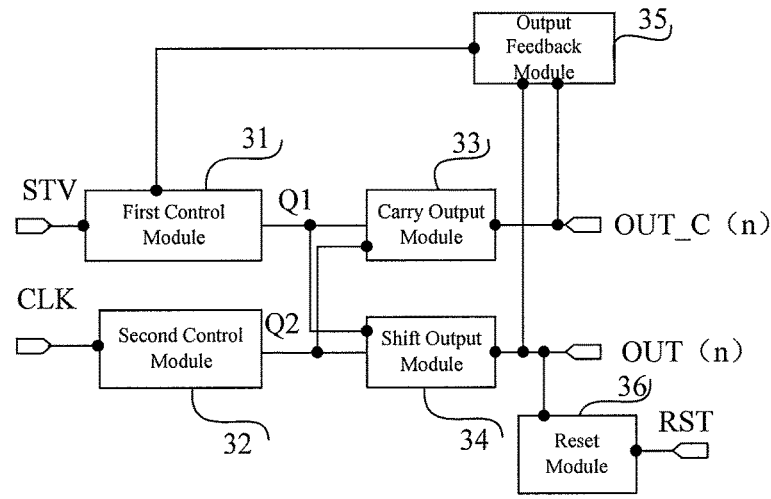
FIG. 4B is a block diagram showing a structure of a shift register unit according to yet another embodiment of the present disclosure.

Alternatively, as shown in FIG. 4B, the shift register unit further includes:

a reset module 36, configured to control the shift signal to be reset.

In FIG. 4B, the reset signal is inputted by a reset signal input end RST.

Specifically, when the shift register unit as shown in FIG. 4B works, there further exists a reset stage after the pre-charge stage and the evaluation stage. In the reset stage, the reset module 36 controls the shift signal to be reset.

Figure 5A:
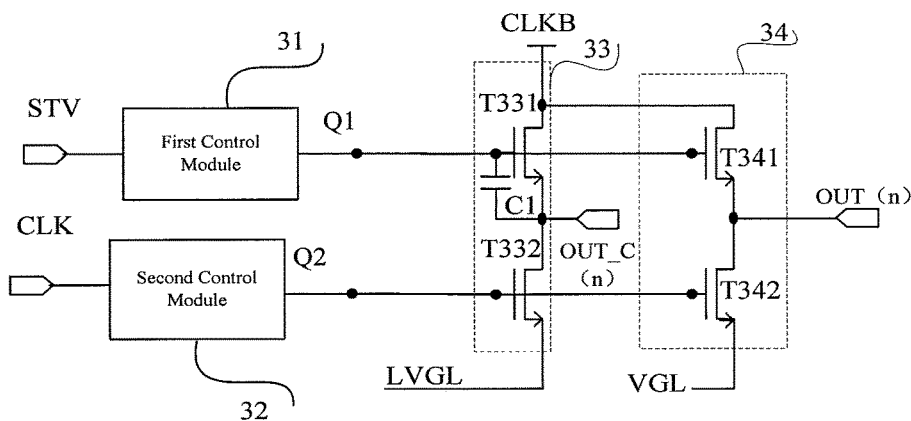
FIGS. 5A, 5B, 5C, 5D and 5E are diagrams showing circuits of shift register units according to embodiments of the present disclosure.

In a specific implementation, as shown in FIG. 5A, the carry output module 33 includes:

a first carry output transistor T331, a gate electrode of which is connected to the first node Q1, a first electrode of which is connected to the carry signal, and a second electrode of which is connected to the second clock signal CLKB; and a second carry output transistor T332, a gate electrode of which is connected to the second node Q2, a first electrode of which is connected to a first low level LVGL, and a second electrode of which is connected to the carry signal.

Alternatively, a bootstrap capacitor C1 is connected between the gate electrode and the first electrode of the first carry output transistor.

The shift output module 34 includes:

a first shift output transistor T341, a gate electrode of which is connected to the first node Q1, a first electrode of which is connected to the shift signal, and a second electrode of which is connected to the second clock signal CLKB; and a second shift output transistor T342, a gate electrode of which is connected to the second node Q2, a first electrode of which is connected to a second low level VGL, and a second electrode of which is connected to the shift signal.

In this embodiment, the first carry output transistor T331, the second carry output transistor T332, the first shift output transistor T341 and/or the second shift output transistor T342 may be depletion-type thin film transistors (TFTs). A threshold voltage of the first carry output transistor T331, a threshold voltage of the second carry output transistor T332, a threshold voltage of the first shift output transistor T341 and a threshold voltage of the second shift output transistor T342 are all the same, which are a depletion threshold voltage. The first low level LVGL is less than the second low level VGL, and an absolute value of a difference between the first low level LVGL and the second low level VGL is larger than an absolute value of the depletion threshold voltage, so as to avoid the effect of the leakage currents of the depletion-type TFTs on the driving signals of the shift register units.

The shift register unit according to the embodiment of the present disclosure uses a two-level output, that is, the carry output module 33 and the shift output module 34. By outputting the carry signal and the shift signal in different levels, the shift signal is maintained at a high level in the evaluation stage, so as to solve the effect of the leakage currents of the depletion-type TFTs on the shift signals of the shift register units.

In addition, in the shift register unit according to the embodiment of the present disclosure, the output feedback module 35 maintains the potential of the first level node Q1 in the evaluation stage to maintain the potentials of the shift signals, thus avoiding the leakage current of the first node Q1 in the evaluation stage which is caused by depletion conducting of the internal TFTs and will affect the outputs.

Figure 5B:
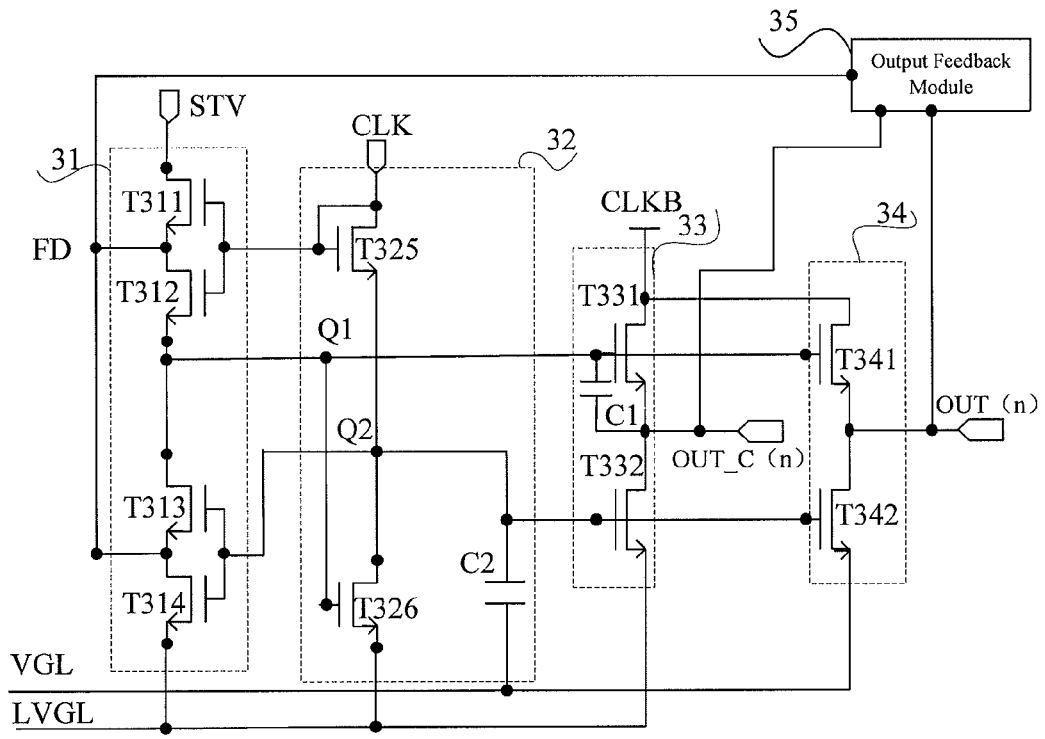

When implemented, as shown in FIG. 5B, the first control module 31 includes a first control transistor T311, a second control transistor T312, a third control transistor T313 and a fourth control transistor T314.

A gate electrode of the first control transistor T311 is connected to the first clock signal CLK, a first electrode of the first control transistor T311 is connected to the output feedback module 35 and the second electrode of the second control transistor T312 respectively, and a second electrode of the first control transistor T311 is connected to the start signal.

A gate electrode of the second control transistor T312 is connected to the first clock signal CLK, and a first electrode of the second control transistor T312 is connected to the first node Q1.

A gate electrode of the third control transistor T313 is connected to the second node Q2, a first electrode of the third control transistor T313 is connected to a second electrode of the fourth control transistor T314 and the output feedback module 35 respectively, and a second electrode of the third control transistor T313 is connected to the first node Q1.

A gate electrode of the fourth control transistor T314 is connected to the second node Q2, and a first electrode of the fourth control transistor T314 is connected to the first low level LVGL.

The second control module 32 includes a fifth control transistor T325, a sixth control transistor T326 and a holding capacitor C2.

A gate electrode of the fifth control transistor T325 is connected to the first clock signal CLK, a first electrode of the fifth control transistor T325 is connected to the second node Q2, and a second electrode of the fifth control transistor T325 is connected to the first clock signal CLK.

A gate electrode of the sixth control transistor T326 is connected to the first node Q1, a first electrode of the sixth control transistor T326 is connected to the first low level LVGL, and a second electrode of the sixth control transistor T326 is connected to the first electrode of the fifth control transistor T325.

The holding capacitor C2 may be connected between the second node Q2 and the second low level output end. The holding capacitor C2 may be inputted with the second low level VGL by the second low level output end.

In FIG. 5B, FD is a node connected the output feedback module 35 and the first control module 31.

Figure 5C:
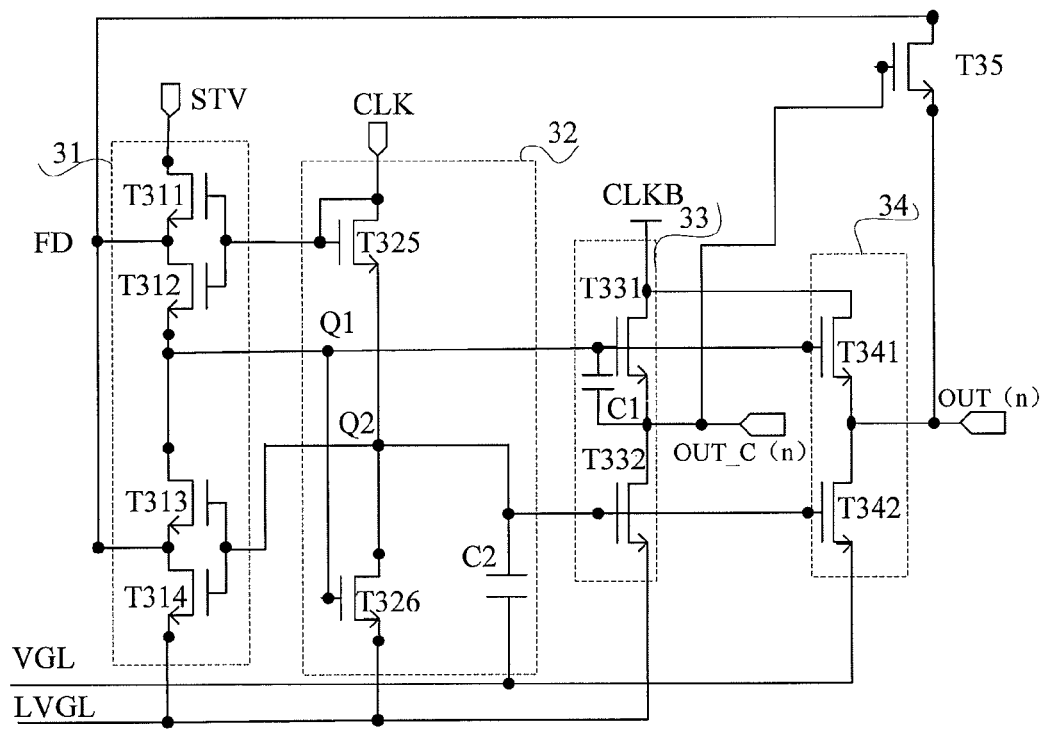

Specifically, as shown in FIG. 5C, the output feedback module 35 includes a feedback transistor T35.

A gate electrode of the feedback transistor T35 is connected to the carry signal, a first electrode of the feedback transistor T35 is connected to the shift signal, and a second electrode of the feedback transistor T35 is connected to the first electrode of the first control transistor T311 and the first electrode of the third control transistor T313 respectively.

Figure 5D:
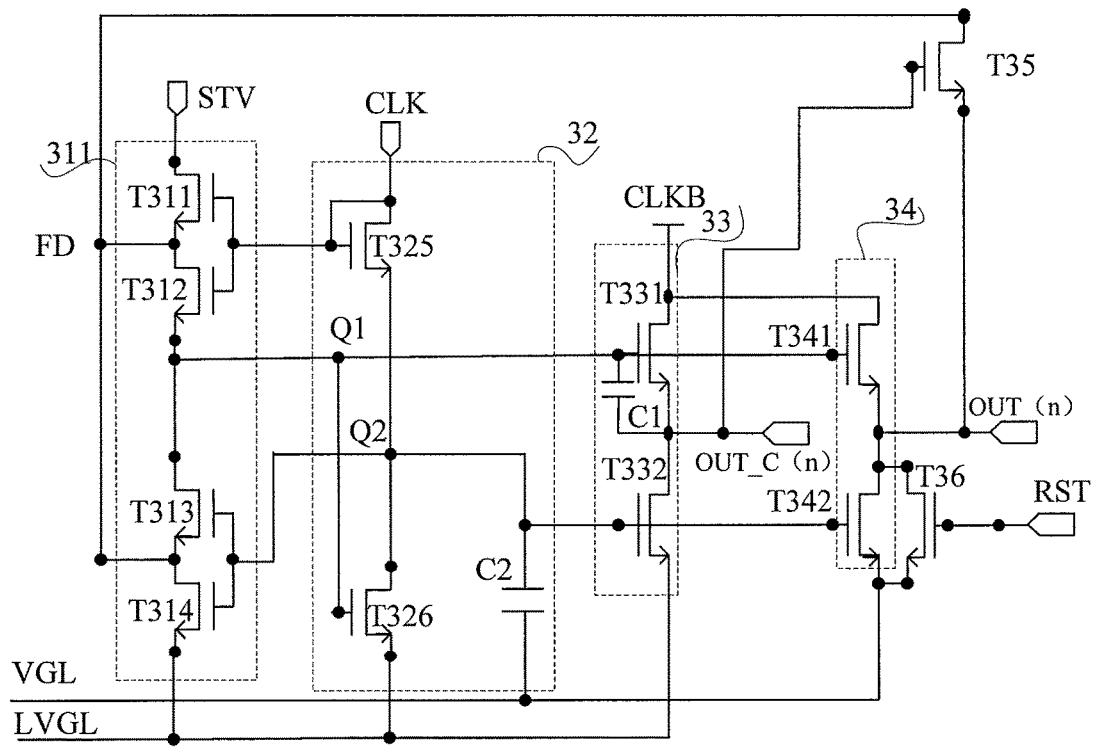

Specifically, as shown in FIG. 5D, the reset module 36 includes a reset transistor T36.

A gate electrode of the reset transistor T36 is connected to an input end RST of a reset signal, a first electrode of the reset transistor T36 is connected to the output end of the second low level, and a second electrode of the reset transistor T36 is connected to the output end OUT(n) of the shift signal.

Figure 5E:
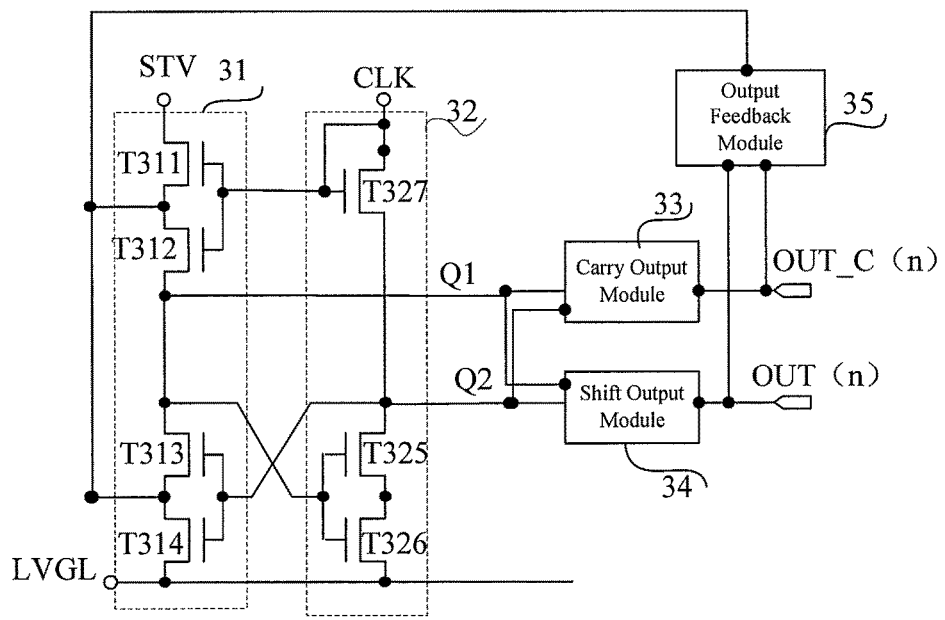

Specifically, as shown in FIG. 5E, the first control module 31 includes a first transistor T311, a second transistor T312, a third transistor T313 and a fourth transistor T314. The second control module 32 includes a fifth transistor T325, a sixth transistor T326 and a seventh transistor T327.

A gate electrode of the first control transistor T311 is connected to the second clock signal CLKB, a first electrode of the first control transistor T311 is connected to the output feedback module 35 and the second electrode of the second control transistor T312 respectively, and a second electrode of the first control transistor T311 is connected to the start signal input end STY.

A gate electrode of the second control transistor T312 is connected to the second clock signal CLKB, a first electrode of the second control transistor T312 is connected to the first control node Q1.

A gate electrode of the third control transistor T313 is connected to the second control node Q2, a first electrode of the third control transistor T313 is connected to a second electrode of the fourth control transistor T314, and a second electrode of the third control transistor T313 is connected to the gate electrode of the fifth transistor T325.

A gate electrode of the fourth control transistor T314 is connected to the gate electrode of the second carry output thin film transistor T2, and a source electrode of the fourth control transistor T314 is connected to the first low level output end.

A gate electrode of the fifth control transistor T325 is connected to the first control node Q1, a first electrode of the fifth control transistor T325 is connected to the second electrode of the sixth transistor T326, and a second electrode of the fifth control transistor T325 is connected to the gate electrode of the sixth transistor T326.

A gate electrode of the sixth control transistor T326 is connected to the first control node Q1, a first electrode of the sixth control transistor T326 is connected to the first low level output end.

A gate electrode and a second electrode of the seventh transistor T327 are connected to the first clock signal CLK, and a first electrode of the seventh transistor T327 is connected to the second control node Q2.

The first low level LVGL is inputted by the first low level output end.

Figure 6:
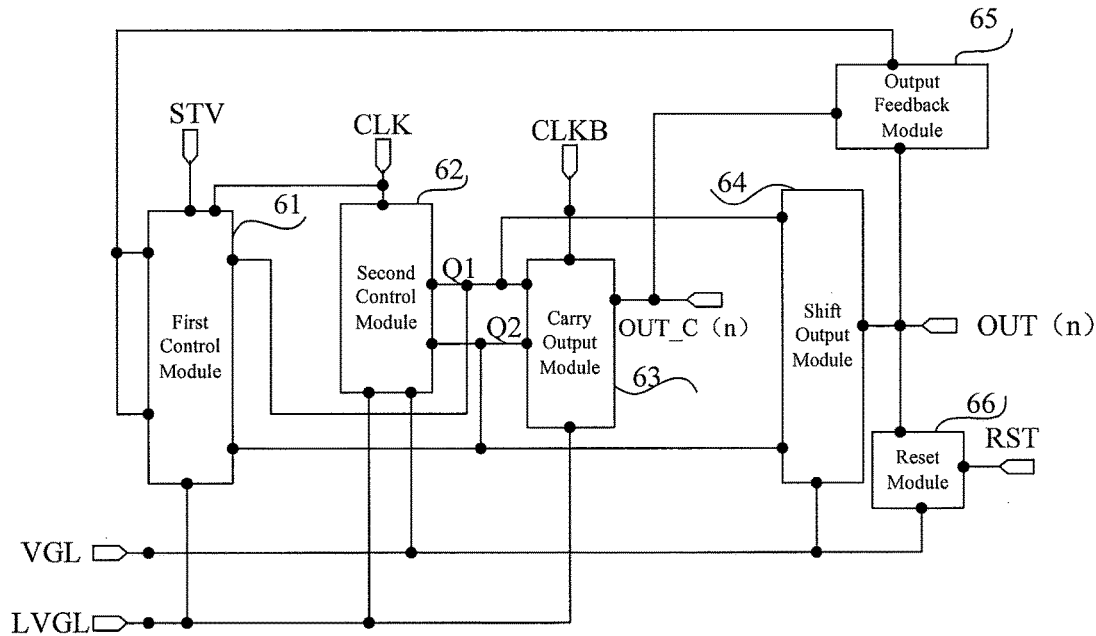
FIG. 6 is a block diagram showing a structure of a shift register unit according to a specific embodiment of the present disclosure.

Description will be given below with an example where N-type transistors are used in the shift register unit. As shown in FIG. 6, the shift register unit includes:

a first control module 61, connected to the first node Q1, the second node Q2, the first clock signal output end, the input end of the start signal and the first low level output end respectively, and configured to pull up the potential of the first node Q1 to a high level in the pre-charge stage and pull down the potential of the first node Q1 to a low level in the reset stage;

a second control module 62, connected to the second node Q2, the first node Q1, the first clock signal output end, the first low level output end and the second low level output end respectively, and configured to pull down the potential of the first node Q1 to a low level in the pre-charge stage, further pull down the potential of the first node Q1 to the first low level LVGL in the evaluation stage, and pull up the potential of the first node Q1 to a high level in the reset stage;

a carry output module 63, connected to the first node Q1, the second node Q2, the second clock signal output end, the first low level output end and the output end OUT_C(n) of the carry signal respectively, and configured to control the output end OUT_C(n) of the carry signal to output the first low level LVGL in the pre-charge stage, output a high level in the evaluation stage and output the first low level LVGL in the reset stage;

a shift output module 64, connected to the first node Q1, the second node Q2, the second low level output end and the output end OUT(n) of the shift signal respectively, and configured to control the output end OUT(n) of the shift signal to output the second low level VGL in the pre-charge stage, and output a high level in the evaluation stage;

a output feedback module 65, connected to the output end OUT_C(n) of the carry signal, the output end OUT(n) of the shift signal and the first control module 61 respectively, and configured to maintain the potential of the first node Q1 at a high level in the evaluation stage by controlling the first control module 61;

a reset module 66, connected to the input end RST of the reset signal, the second low level output end and the output end OUT(n) of the shift output signal, and configured to control the output end OUT(n) of the shift signal to output the second low level VGL in the reset stage.

In an embodiment of the present disclosure, the input end of the first level inputs the first low level LVGL, and the input end of the second level inputs the second low level VGL. The input end of the start signal inputs the start signal RST, and the input end of the reset signal inputs the reset signal RST. The input end of the first clock signal inputs the first clock signal CLK, and the input end of the second clock signal inputs the second clock signal CLKB. Additionally, CLK and CLKB are inverted.

In the embodiment as shown in FIG. 6, the first low level LVGL and the second low level VGL are different. For example, the first low level LVGL is less than the second low level VGL. And two output ends (i.e., the carry signal output end and the shift signal output end) are used in this embodiment, so a negative voltage difference is formed between the gate electrode voltage and the source electrode voltage of the TFTs inside the shift register unit, making the TFTs inside the shift register unit can be completely turned off. Thus erroneous output can be avoided, thereby avoiding the effect of the leakage currents of the TFTs on the drive signals of the shift register unit. And in the embodiment, instead of a high voltage signal, an AC first clock signal is used to control the second control module 62, to reduce the effect of the DC bias voltages on characteristics of TFTs.

In the embodiment, two clock signals (i.e., the first clock signal CLK and the second clock signal CLKB) are used to control the shift register unit, enabling the control more flexible and precise.

Figure 6A:
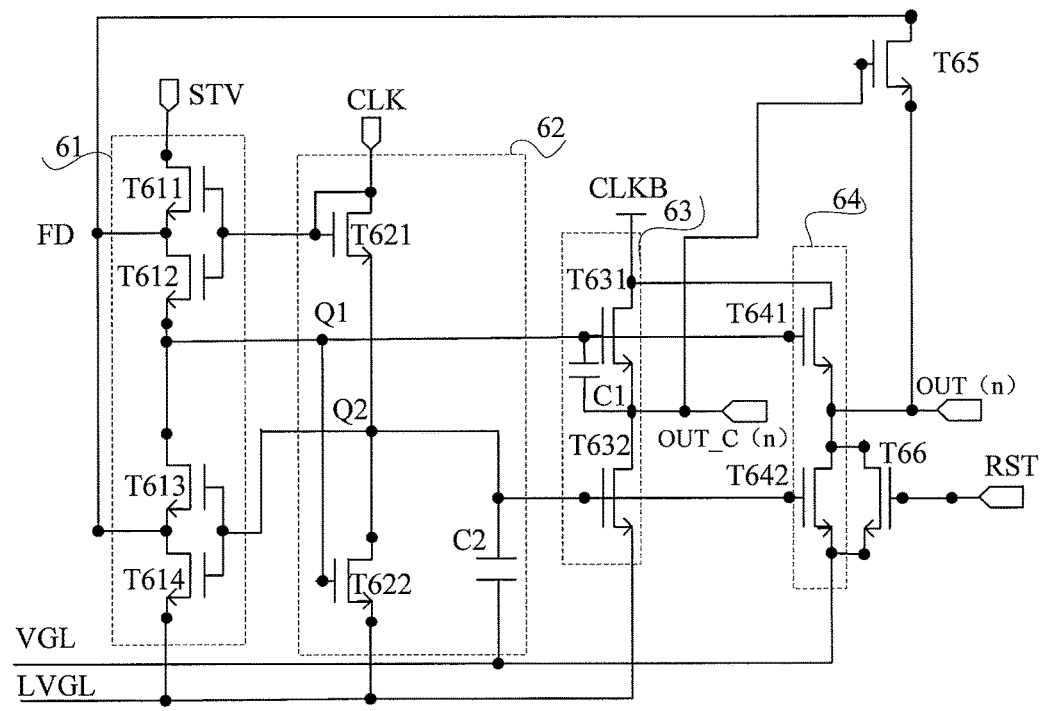
FIG. 6A is a diagram showing a circuit of the shift register unit according to the specific embodiment of the present disclosure.

Alternatively, as shown in FIG. 6A, the carry output module 63 includes a first carry output transistor T631 and a second carry output transistor T632.

A gate electrode of the first carry output transistor T631 is connected to the first node Q1, a first electrode of the first carry output transistor T631 is connected to the output end OUT_C(n) of the carry signal, and a second electrode of the first carry output transistor T631 is connected to the second clock signal output end.

A gate electrode of the second carry output transistor T632 is connected to the second node Q2, a first electrode of the second carry output transistor T632 is connected to the first low level output end, and a second electrode of the second carry output transistor T632 is connected to the output end OUT_C(n) of the carry signal.

Alternatively, as shown in FIG. 6A, the shift output module 64 includes a first shift output transistor T641 and a second shift output transistor T642.

A gate electrode of the first shift output transistor T641 is connected to the first node Q1, a first electrode of the first shift output transistor T641 is connected to the output end OUT(n) of the shift signal, and a second electrode of the first shift output transistor T641 is connected to the second clock signal output end.

A gate electrode of the second shift output transistor T642 is connected to the second node Q2, a first electrode of the second shift output transistor T642 is connected to the second low level output end, and a second electrode of the second shift output transistor T642 is connected to the output end OUT(n) of the shift signal.

When implemented, the first carry output transistor T641, the second carry output transistor T642, the first shift output transistor T651 and/or the second shift output transistor T652 are depletion-type thin film transistors.

Alternatively, the first carry output transistor T641, the second carry output transistor T642, the first shift output transistor T651 and the second shift output transistor T652 are depletion-type thin film transistors.

Alternatively, as shown in FIG. 6A, in the shift register unit the threshold voltage of the first carry output thin film transistor T631, the threshold voltage of the second carry output thin film transistor T632, the threshold voltage of the first shift output transistor T641 and the threshold voltage of the second shift output transistor T642 are all the same, which are the depletion threshold voltage.

The first low level LVGL is less than the second low level VGL, and an absolute value of a difference between the first low level LVGL and the second low level VGL is larger than an absolute value of the depletion threshold voltage.

Alternatively, as shown in FIG. 6A, the first control module 61 includes a first pulling-up transistor T611, a second pulling-up transistor T612, a third pulling-up transistor T613, a fourth pulling-up transistor T614 and a bootstrap capacitor C1.

A gate electrode of the first pulling-up transistor T611 is connected to the first clock signal output end, a first electrode of the first pulling-up transistor T611 is connected to the output feedback module 65 and the second electrode of the second pulling-up transistor T612 respectively, a second electrode of the first pulling-up transistor T611 is connected to the input end of the start signal.

A gate electrode of the second pulling-up transistor T612 is connected to the first clock signal output end and a first electrode of the second pulling-up transistor T612 is connected to the first node Q1.

A gate electrode of the third pulling-up transistor T613 is connected to the second node Q2, a first electrode of the third pulling-up transistor T613 is connected to the output feedback module 65 and the second electrode of the fourth pulling-up transistor T614 respectively, a second electrode of the third pulling-up transistor T613 is connected to the first node Q1.

A gate electrode of the fourth pulling-up transistor T614 is connected to the second node Q2, a first electrode of the fourth pulling-up transistor T614 is connected to the first low level output end.

The bootstrap capacitor C1 is connected between the first node Q1 and the output end OUT_C(n) of the carry signal.

Alternatively, as shown in FIG. 6A, the second control module 62 includes a first pulling-down transistor T621, a second pulling-down transistor T622 and a holding capacitor C2.

A gate electrode of the first pulling-down transistor T621 is connected to the first clock signal output end, a first electrode of the first pulling-down transistor T621 is connected to the second node Q2, and a second electrode of the first pulling-down transistor T621 is connected to the first clock signal output end.

A gate electrode of the second pulling-down transistor T622 is connected to the first node Q1, a first electrode of the second pulling-down transistor T622 is connected to the first low level output end, and a second electrode of the second pulling-down transistor T622 is connected to the first electrode of the first pulling-down transistor T21.

The holding capacitor C2 may be connected between the second node Q2 and the second low level output end.

Alternatively, the output feedback module 65 includes a feedback transistor T65.

A gate electrode of the feedback transistor T65 is connected to the output end OUT_C(n) of the carry signal, a first electrode of the feedback transistor T65 is connected to the output end OUT(n) of the shift signal, and a second electrode of the feedback transistor T65 is connected to the first electrode of the first pulling-up transistor T611 and the first electrode of the third pulling-up transistor T613 respectively.

In FIG. 6A, FD is a node connected between the second electrode of the feedback transistor T65 and the first electrode of the first pulling-up transistor T611.

Alternatively, as shown in FIG. 6A, the reset module 66 includes a reset transistor T66.

A gate electrode of the reset transistor T66 is connected to the input end RST of the reset signal, a first electrode of the reset transistor T66 is connected to the second low level output end, and a second electrode of the reset transistor T66 is connected to the output end OUT(n) of the shift signal.

In an embodiment of the present disclosure, all the used transistors are depletion-type thin film transistors. Further, in an embodiment of the present disclosure, all the depletion-type thin film transistors used in the shift register unit are of a same type. For example, in an embodiment of the present disclosure, all the transistors used in the shift register unit are N-type depletion-type thin film transistors or P-type depletion-type thin film transistors.

Figure 6B:
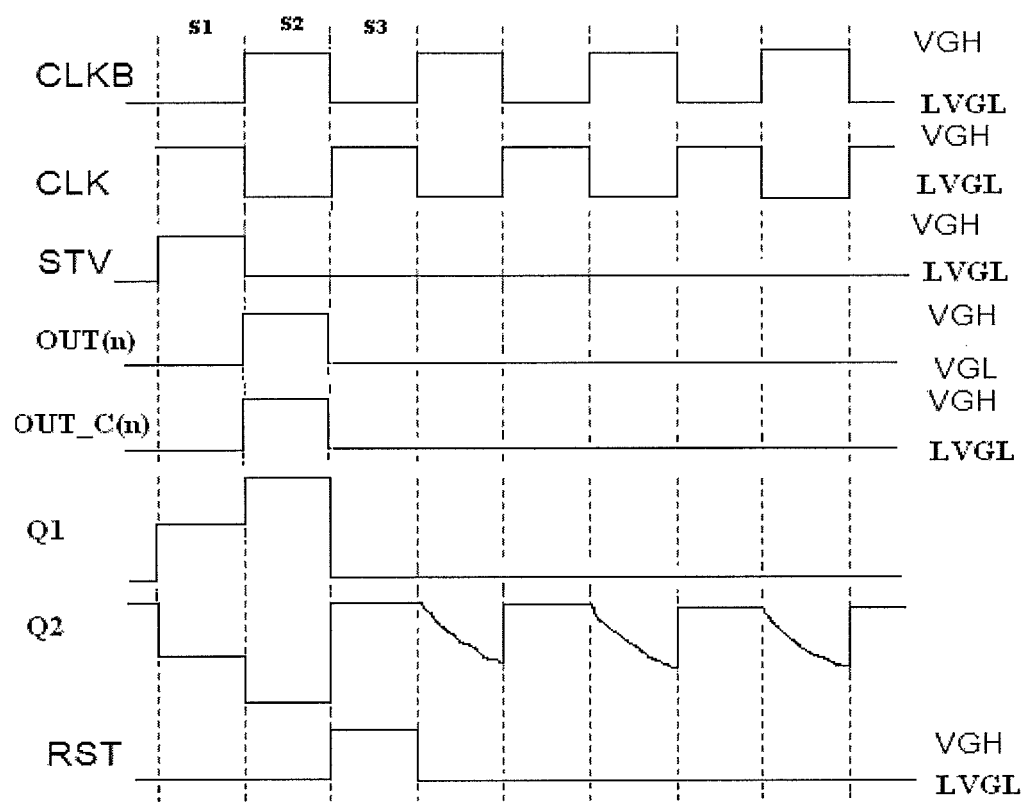
FIG. 6B is a sequence diagram of respective signals of the shift register unit according to the specific embodiment of the present disclosure during working process.

As shown in FIG. 6B, in an embodiment of the present disclosure a work process of the shift register unit can be divided into three stages as follows.

The first stage is a pre-charge stage S1, in which CLK is the high level VGH, CLKB is the first low level LVGL, the input end STV of the start signal inputs the high level VGH, and the input end RST of the reset signal inputs the first low level LVGL.

Correspondingly, transistors T611, T612 and T621 are turned on; the voltage of the node Q1 (the node connected to the gate electrode of the carry output transistor and the gate electrode of the shift output transistor) is gradually increased (but less than a high level VGH); thus C1 is charged by the node Q1, and the transistor T622 is turned on, thereby the voltage of the node Q2 is gradually decreased (less than LVGL). At this time, transistors T632, T614, T642 are turned on, and the transistor T613 is turned on immediately at the beginning of pre-charge stage S1. After that, the voltages of the nodes FD and Q1 become the same. Then the transistor T613 is turned off. Along with the potential of the node Q1 increasing, transistors T631 and T641 are turned on; and transistors T66 and T65 are turned off.

That is, in the pre-charge stage S1, the start signal STV charges C1 via the turned-on transistors T611 and T612 to make the voltage of the node Q1 be gradually increased (but the voltage of the node Q1 is still lower than VGH) and the voltage of the node Q2 be gradually decreased (but the voltage of the node Q2 is still higher than LVGL). Thus transistors T631, T632, T641 and T642 are turned on, whereby OUT(n) outputs VGL and OUT_C (n) outputs LVGL.

The second stage is a evaluation stage S2, in which CLK is the first low level LVGL; CLKB is the high level VGH; the input end STV of the start signal inputs the first low level LVGL, and the input end of the reset signal inputs the first low level LVGL.

The transistors T631, T641 are turned on; OUT(n) outputs the high level VGH and OUT_C(n) outputs the high level VGH. The transistors T611 and T612 are turned off.

The transistor T622 is turned on and the transistor T621 is turned off.

The potential of the node Q2 continues to be decreased to LVGL.

The transistor T613 and the transistor T614 are turned off.

The transistor T632 is turned off and the transistor T642 is turned off.

The transistor T65 is turned off, the potential of the node FD is gradually increased (but less than VGH). So the node Q1 is in a floating condition (i.e., both of the transistors T612 and T613 connected to Q1 are turned off, there is no signal coming over). The potential of the node Q1 is bootstrapped to a higher level by the bootstrap capacitor C1, and continues to be increased, thus ensuring that there is no threshold loss in the voltage outputted by OUT(n).

The third stage is a reset stage S3, in which the input end RST of the reset signal inputs the high level VGH; CLKB is the low level LVGL; CLK is the high level VGH; and the input end STV of start signal inputs the first low level LVGL.

At this time, transistors T611 and T612 are turned on, and since the potential of CLK is the high level, the transistor T621 is turned on, whereby the potential of the node Q2 is the high level, thus the transistors T613 and T614 are turned on and the potential of the node Q1 is pulled down to LVGL.

The transistor T621 is conductive (ON), so the potential of the node Q1 becomes to be a low level, thereby the transistors T631 and T641 are turned off.

During the process of Q1 being gradually decreased, the transistor T622 is turned on firstly, but then along with the potential of the node Q1 is decreased to the low level, the transistor T622 is turned off. Since the transistor T622 is a depletion-type TFT, the current flowing through the transistor T622 is small. And because of the voltage holding function of C2, the potential of the node Q2 can be always maintained at a high level.

Because of the potential of Q1 being maintained at a high level, the transistors T32 and T42 are completely turned on. And besides, at this time, RST outputs a high level, the transistor T66 is completely turned on, thus OUT_C(n) outputs LVGL, OUT(n) outputs VGL, and the transistor T65 is turned off.

In the embodiment of the present disclosure, the shift register unit divides the output into two levels, i.e., the carry output module and the shift output module. In addition, the carry output module and the shift output module are driven by the first low level LVGL and the second low level VGL respectively. The first low level LVGL and the second low level VGL are different, thus avoiding the effect of the leakage currents generated by depletion conduction of the transistors T41, T42 on the outputs. Meanwhile, in an embodiment of the present disclosure, by using the feedback transistor T65 to control the internal node, the effect of the leakage currents at the node Q1 in the evaluation stage by depletion conducting of internal TFTs on the outputs is avoided. In addition, the control voltages of gate and source electrodes of the feedback transistor T65 are controlled by different low level voltages respectively, avoiding the inverse influence of potential changes of internal nodes on the outputs. Since the transistors T31, T32 only drive the carry outputs, the sizes thereof can be minimized.

An embodiment of the present disclosure provides a method for driving the shift register unit, which may be applied to the above-mentioned shift register unit, including the following steps:

transmitting, by the first control module, the start signal to the first node; and pulling, by the second control module, the potential of the second node to a potential inverted to the potential of the first node under the control of the first clock signal, in a pre-charge stage;

pulling, by the second control module, the potential of the second node to the potential inverted to the potential of the first node under the control of the first clock signal; outputting, by the carry output module, the carry signal according to the potential of the first node and the potential of the second node; outputting, by the shift output module, the shift signal according to the potential of the first node and the potential of the second node, in an evaluation stage.

When implemented, in an embodiment of the present disclosure, the method for driving the shift register unit further includes:

maintaining, by the output feedback module, the potential of the first node by controlling the first control module according to the carry signal and the shift signal, in the pre-charge stage.

An embodiment of the present disclosure further provides a shift register, including the above-mentioned shift register unit;

except for a first level shift register unit, an input end of the start signal of each level shift register unit is connected to the carry signal output end of a previous level shift register unit.

Figure 7:
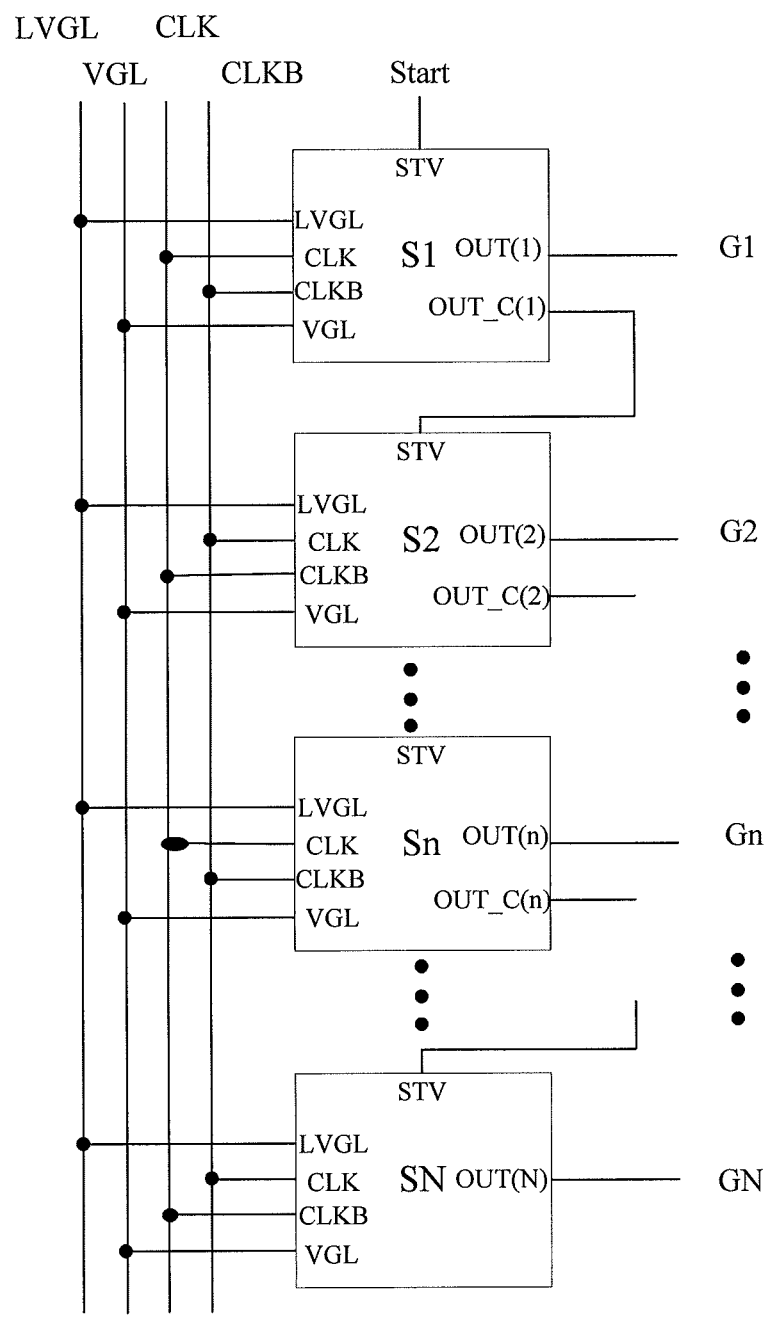
FIG. 7 is a diagram showing a circuit of the shift register according to an embodiment of the present disclosure.

As shown in FIG. 7, the shift register of the first embodiment of the present disclosure is constituted of N-level connected shift register units, so as to be an active matrix line scanner, where N is a line number of the active matrix and a positive integer.

S1, S2 . . . , Sn . . . SN represent a first level shift register unit, a second level shift register unit . . . an n-th level shift register unit . . . an N-th level shift register unit respectively.

Each of the shift register unit is connected to the first clock signal output end, the second clock signal output end, the first low level output end and the second low level output end respectively.

The clock signal outputted by the first clock signal output end and clock signal outputted by the second clock signal output end are inverted to each other, and duty ratios thereof are, for example, 50% respectively, but not limited thereto.

The input end STV of the start signal of first level shift register is inputted with an initial pulse signal Start, which is effective when it is a high level.

Except for the first level shift register unit, the input end of the start signal of each level shift register unit is connected to the carry signal output end of a previous level shift register unit. Each level shift register has two output ends that is, OUT_C(n) which is the carry signal output end and connected to the input end STV of the start signal of the next level shift register unit, and OUT(n) which is the driving signal output end and connected to the line scan lines Gn of the active matrix, where n is a positive integer and less than or equal to N.

The clock control signals of two adjacent shift register units are inverted to each other. For example if the input end of the first clock of the first level shift register unit is connected to the first clock signal CLK and the input end of the second clock signal of the first level shift register unit is connected to the second clock signal CLKB, then the input end of the first clock signal of the second level shift register unit adjacent to the first level shift register unit is connected to the second clock signal CLKB, and the input end of the second clock signal of the second level shift register unit is connected to the first clock signal CLK.

An embodiment of the present disclosure further provides a display device, including the above-mentioned shift register. The display device may include liquid crystal display devices, such as liquid crystal panels, liquid crystal TVs, mobile phones, and liquid crystal display devices. Besides the liquid crystal display devices, the display device may further include organic light emitting display devices or other display devices, such as electronic readers and the like. The shift register may be used as scanning circuits or gate driving circuits for display devices, so as to provide a progressive scan function and transmit scan signals to the display area.

The above is only preferred embodiments of the present disclosure, it should be noted that several improvements and modifications may be made for those of ordinary skill in the art without departing from the principle of the present disclosure, and also should be considered to fall within the protection scope of the present disclosure.

What is claimed is:

1. A shift register unit, comprising:
a first control module, configured to transmit a start signal to a first node;
a second control module, configured to pull a potential of a second node to a potential different from a potential of the first node, under a control of a first clock signal, wherein the first clock signal is an alternating current (AC) signal;
a carry output module, configured to output a carry signal according to the potential of the first node and the potential of the second node; and
a shift output module, configured to output a shift signal according to the potential of the first node and the potential of the second node, wherein:
the second control module comprises a first control transistor, a second control transistor, and a holding capacitor;
a gate electrode of the first control transistor is connected to a first clock signal output end to receive the first clock signal;
a first electrode of the first control transistor is connected to the second node;
a second electrode of the second transistor is connected to a first clock signal output end;
a gate electrode of the second control transistor is connected to the first node;
a first electrode of the second control transistor is connected to a first low level output end;
a second electrode of the second control transistor is connected to the first electrode of the first control transistor; and
the holding capacitor is connected between the second node and a second low level output end.

2. The shift register unit according to claim 1, further comprising:
an output feedback module, configured to maintain the potential of the first node by controlling the first control module according to the carry signal and the shift signal.

3. The shift register unit according to claim 1, further comprising:
a reset module, configured to control the shift signal to be reset.

4. The shift register unit according to claim 1, wherein the carry output module comprises a first carry output transistor and a second carry output transistor;
a gate electrode of the first carry output transistor is connected to the first node, a first electrode of the first carry output transistor is connected to a carry signal output end, and a second electrode of the first carry output transistor is connected to a second clock signal output end;
a gate electrode of the second carry output transistor is connected to the second node, a first electrode of the second carry output transistor is connected to the first low level output end, and a second electrode of the second carry output transistor is connected to the carry signal output end; and
a bootstrap capacitor is connected between the gate electrode and the first electrode of the first carry output transistor.

5. The shift register unit according to claim 4, wherein the shift output module comprises a first shift output transistor and a second shift output transistor;
a gate electrode of the first shift output transistor is connected to the first node, a first electrode of the first shift output transistor is connected to a shift signal output end, and a second electrode of the first shift output transistor is connected to a second clock signal output end; and
a gate electrode of the second shift output transistor is connected to the second node, a first electrode of the second shift output transistor is connected to the second low level output end, and a second electrode of the second shift output transistor is connected to the shift signal output end.

6. The shift register unit according to claim 5, wherein
the first carry output transistor, the second carry output transistor, the first shift output transistor and/or the second shift output transistor are depletion-type thin film transistors (TFTs);
a threshold voltage of the first carry output transistor, a threshold voltage of the second carry output transistor, a threshold voltage of the first shift output transistor and a threshold voltage of the second shift output transistor are all the same, which are a depletion threshold voltage.

7. The shift register unit according to claim 6, wherein the first low level is less than the second low level, and an absolute value of a difference between the first low level and the second low level is larger than an absolute value of the depletion threshold voltage.

8. The shift register unit according to claim 2, wherein the first control module comprises a third control transistor, a fourth control transistor, a fifth control transistor, and a sixth control transistor;
a gate electrode of the third control transistor is connected to the first clock signal output end, a first electrode of the third control transistor is connected to the output feedback module and the second electrode of the second control transistor respectively, and a second electrode of the third control transistor is connected to an input end of the start signal;
a gate electrode of the fourth control transistor is connected to the first clock signal output end, and a first electrode of the fourth control transistor is connected to the first node;
a gate electrode of the fifth control transistor is connected to the second node, a first electrode of the fifth control transistor is connected to a second electrode of the sixth control transistor and the output feedback module respectively, and a second electrode of the fifth control transistor is connected to the first node; and
a gate electrode of the sixth control transistor is connected to the second node, and a first electrode of the sixth control transistor is connected to the first low level output end.

9. The shift register unit according to claim 8, wherein the output feedback module comprises a feedback transistor;
a gate electrode of the feedback transistor is connected to a carry signal output end, a first electrode of the feedback transistor is connected to a shift signal output end, and a second electrode of the feedback transistor is connected to the first electrode of the third control transistor and the first electrode of the fifth control transistor respectively.

10. The shift register unit according to claim 3, wherein the reset module comprises a reset transistor;
a gate electrode of the reset transistor is connected to an input end of a reset signal, a first electrode of the reset transistor is connected to the second low level output end, and a second electrode of the reset transistor is connected to a shift signal output end.

11. A method for driving a shift register unit, wherein the shift register unit comprises: a first control module, configured to transmit a start signal to a first node; a second control module, configured to pull a potential of a second node to a potential different from a potential of the first node under a control of a first clock signal that is an alternating current (AC) signal; a carry output module, configured to output a carry signal according to the potential of the first node and the potential of the second node; and a shift output module, configured to output a shift signal according to the potential of the first node and the potential of the second node;

wherein the second control module includes a first control transistor, a second control transistor and a holding a capacitor:

a gate electrode of the first control transistor is connected to a first clock signal output end to receive the first clock signal, a first electrode of the first control transistor is connected to the second node, and a second electrode of the first control transistor is connected to the first clock signal output end;

a gate electrode of the second control transistor is connected to the first node, a first electrode of the second control transistor is connected to a first low level output end, and a second electrode of the second control transistor is connected to the first electrode of the first control transistor;

the holding capacitor is connected between the second node and a second low level output end, the method comprising:

transmitting, by the first control module, the start signal to the first node; and pulling, by the second control module, the potential of the second node to a potential inverted to the potential of the first node under the control of the first clock signal, in a pre-charge stage;

pulling, by the second control module, the potential of the second node to the potential inverted to the potential of the first node under the control of the first clock signal;

outputting, by the carry output module, the carry signal according to the potential of the first node and the potential of the second node; and outputting, by the shift output module, the shift signal according to the potential of the first node and the potential of the second node, in an evaluation stage.

12. The method according to claim 11, wherein the shift register unit further comprises an output feedback module, the method further comprising:

maintaining, by the output feedback module, the potential of the first node by controlling the first control module according to the carry signal and the shift signal, in the pre-charge stage.

13. The method according to claim 11, wherein the shift register unit further comprises a reset module, the method further comprising:

controlling, by the reset module, the shift signal to be reset, in a reset stage.

14. A display device, comprising a shift register, including multi-level shift register units;

wherein, except for a first level shift register unit, a start input end of each level shift register unit is connected to a carry signal output end of a previous level shift register unit;

wherein each of the multi-level shift register units comprises:

a first control module, configured to transmit a start signal to a first node;

a second control module, configured to pull a potential of a second node to a potential different from a potential of the first node, under a control of a first clock signal that is an alternating current (AC) signal;

a carry output module, configured to output a carry signal according to the potential of the first node and the potential of the second node; and a shift output module, configured to output a shift signal according to the potential of the first node and the potential of the second node, wherein:

the second control module includes a first control transistor, a second control transistor, and a holding capacitor;

a gate electrode of the first control transistor is connected to a first clock signal output end to receive the first clock signal;

a first electrode of the first control transistor is connected to the second node;

a second electrode of the first control transistor is connected to the first clock signal output end;

a gate electrode of the second control transistor is connected to the first node;

a first electrode of the second control transistor is connected to a first low level output end;

a second electrode of the second control transistor is connected to the first electrode of the first control transistor; and the holding capacitor is connected between the second node and a second low level output end.

15. The display device according to claim 14, wherein each of the multi-level shift register units comprises an output feedback module, configured to maintain the potential of the first node by controlling the first control module according to the carry signal and the shift signal.

16. The display device according to claim 14, wherein each of the multi-level shift register units comprises a reset module, configured to control the shift signal to be reset.

17. The display device according to claim 14, wherein the carry output module comprises a first carry output transistor and a second carry output transistor;

a gate electrode of the first carry output transistor is connected to the first node, a first electrode of the first carry output transistor is connected to a carry signal output end, and a second electrode of the first carry output transistor is connected to a second clock signal output end;

a gate electrode of the second carry output transistor is connected to the second node, a first electrode of the second carry output transistor is connected to the first low level output end, and a second electrode of the second carry output transistor is connected to the carry signal output end; and a bootstrap capacitor is connected between the gate electrode and the first electrode of the first carry output transistor.

18. The display device according to claim 17, wherein the shift output module comprises a first shift output transistor and a second shift output transistor;

a gate electrode of the first shift output transistor is connected to the first node, a first electrode of the first shift output transistor is connected to a shift signal output end, and a second electrode of the first shift output transistor is connected to a second clock signal output end; and a gate electrode of the second shift output transistor is connected to the second node, a first electrode of the second shift output transistor is connected to the second low level output end, and a second electrode of the second shift output transistor is connected to the shift signal output end.

19. The display device according to claim 18, wherein the first carry output transistor, the second carry output transistor, the first shift output transistor and/or the second shift output transistor are depletion-type thin film transistors (TFTs); and a threshold voltage of the first carry output transistor, a threshold voltage of the second carry output transistor, a threshold voltage of the first shift output transistor and a threshold voltage of the second shift output transistor are all the same, which are a depletion threshold voltage.

* * * * *